United States Patent
Moutinho

(10) Patent No.: US 6,323,129 B1
(45) Date of Patent: Nov. 27, 2001

(54) PROCESS FOR MAINTAINING A SEMICONDUCTOR SUBSTRATE LAYER DEPOSITION EQUIPMENT CHAMBER IN A PRECONDITIONED AND LOW PARTICULATE STATE

(75) Inventor: Thomas J. Moutinho, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/285,635

(22) Filed: Apr. 2, 1999

(51) Int. Cl.$^7$ .................................................. H01L 21/44
(52) U.S. Cl. .................. 438/680; 427/250; 427/255.2; 427/294; 427/576; 118/500; 118/585; 118/728; 118/729
(58) Field of Search .................. 438/680; 427/250, 427/255.2, 294, 404, 576; 118/585, 500, 728, 724

(56) References Cited

U.S. PATENT DOCUMENTS

| 5,476,548 | * | 12/1995 | Lei et al. | 118/728 |
| 5,728,602 | | 3/1998 | Bellows et al. | 437/225 |
| 5,738,917 | * | 4/1998 | Besser et al. | 427/576 |

OTHER PUBLICATIONS

Wolf, S., et al.: *Silicon Processing for the VLSI Era*, vol. 1, Process Technology, Lattice Press (1986).

* cited by examiner

Primary Examiner—David Nelms
Assistant Examiner—Reneé Berry
(74) Attorney, Agent, or Firm—Stallman & Pollock LLP

(57) ABSTRACT

A process for maintaining a semiconductor substrate layer (e.g. a TiN, W or TEOS) deposition equipment chamber in a preconditioned and low particulate state between successive layer depositions. The first step is determining that the equipment chamber has been in an idle state for more than a first predetermined time period. In the second step, the equipment chamber pressure is reduced to its base pressure in the absence of gas flow, while maintaining the equipment chamber at a first predetermined temperature. In the third step, the equipment chamber is maintained at a second predetermined temperature for a second predetermined time period. During this step, the equipment chamber pressure is held at a first predetermined pressure, while an inert gas is discharged at a first predetermined inert gas flow rate through the equipment chamber. The pressure, time period and gas flow rate in this step are selected in such a way that adequate and thorough heating (i.e. preconditioning) of the equipment chamber and any associated hardware is provided. During the fourth step, the equipment chamber is purged with a inert gas(s) at a second predetermined inert gas flow rate that is greater than the first predetermined inert gas flow rate, to dislodge particulates within the equipment chamber, while maintaining the equipment chamber at a third predetermined temperature. The process sequence from the second step to the fourth step is repeated a predetermined number of times, typically 4 to 6 times. The equipment chamber is then returned to the idle state.

14 Claims, 1 Drawing Sheet

PROCESS FOR MAINTAINING A SEMICONDUCTOR SUBSTRATE LAYER DEPOSITION EQUIPMENT CHAMBER IN A PRECONDITIONED AND LOW PARTICULATE STATE

BACKGROUND OF THE INVENTION

1. Field of the Invention

The present invention relates to semiconductor device manufacturing procedures and, in particular, to manufacturing procedures that optimize semiconductor substrate processing equipment performance.

2. Description of the Related Art

Semiconductor device manufacturing often involves the processing of a semiconductor substrate (e.g. a silicon wafer) through a series of steps, including the implantation of dopant atoms into the substrate, the formation of insulating and conducting layers on the substrate and the subsequent patterning of the layers via lithography and etching techniques. Cost effective semiconductor device manufacturing requires that both the design of the equipment used to process the semiconductor substrate in each step and the manufacturing procedures employed to operate such equipment be optimized in terms of equipment throughput, non-generation of equipment particulates and process uniformity.

For certain types of equipment and, in particular, single wafer Chemical Vapor Deposition (CVD) chambers and single wafer plasma etch chambers, process uniformity (such as wafer-to-wafer etch rate uniformity and layer deposition rate uniformity) can be degraded if the equipment is not in a proper preconditioned state upon the onset of processing. Furthermore, excessive particulate generation from sources within the equipment can result in malformed patterned layers and inoperable devices, and may lead to other undesirable consequences. While intrusive equipment maintenance procedures can be employed to decrease particle levels therein, these procedures consume valuable equipment time that would otherwise be available for semiconductor substrate processing and, therefore, reduce equipment throughput.

Cycled purge processes designed to reduce particle/contaminant levels in Low Pressure Chemical Vapor Deposition (LPCVD) furnace equipment are known in the art. See U.S. Pat. 5,728,602 to Bellows et al., which is hereby fully incorporated by reference. Conventional cycled purge processes are, however, targeted solely at reducing particle/contaminant levels and do not provide for maintaining the equipment chamber and associated hardware in a proper preconditioned state.

There is, therefore, still a need in the field for a process that maintains a semiconductor substrate layer deposition equipment chamber in a proper preconditioned state, reduces particle levels, and improves equipment throughput by prolonging the time between intrusive maintenance procedures.

SUMMARY OF THE INVENTION

The present invention provides a process for maintaining a semiconductor substrate layer deposition equipment chamber in a preconditioned and low particulate state between successive layer depositions. By maintaining the equipment chamber in the preconditioned and low particulate state, the frequency of intrusive maintenance procedures, and thus the resultant equipment chamber downtime, is reduced.

Processes in accordance with the present invention include a first step of determining that an equipment chamber has been in an idle state for more than a first predetermined time period (e.g. five minutes). Upon such a determination, a second step of reducing the equipment chamber pressure to its base pressure follows. The second step occurs in the absence of gas flow, while simultaneously maintaining the equipment chamber at a first predetermined temperature. The equipment chamber can be, for example, a titanium-nitride (TiN), tungsten (W), or tetraethylorthosilicate (TEOS) based oxide layer deposition equipment chamber. In a third step, the equipment chamber is then maintained at a first predetermined pressure that is greater than the base pressure and at a second predetermined temperature for a second predetermined time period. During the third step, an inert gas, such as helium, argon, nitrogen, hydrogen or mixtures thereof, is discharged through the equipment chamber at a first predetermined inert gas flow rate. The first predetermined pressure, the second predetermined time period and the first predetermined inert gas flow rate are preselected to insure adequate and thorough heating (i.e. preconditioning) of the equipment chamber and any associated hardware at a given second predetermined temperature. A typical range of the first predetermined pressure is from 2 Torr to 4 Torr, while that of the second predetermined time period is from 240 seconds to 360 seconds, and that of the first predetermined inert gas flow rate is from 400 sccm to 600 sccm. In a fourth step, the equipment chamber is then purged with an inert gas, such as helium, argon, nitrogen, hydrogen or mixtures thereof, at a second predetermined inert gas flow rate for a third predetermined time period while the equipment chamber is maintained at a third predetermined temperature. The second predetermined inert gas flow rate is greater than the first predetermined inert gas flow rate, and the third predetermined temperature is suitable for the commencement of a subsequent semiconductor substrate layer deposition process. The third predetermined time period and the second predetermined inert gas flow rate are selected to provide the dislodgement of particulates from within the equipment chamber and any associated hardware. A typical range of the second predetermined inert gas flow rates (per particular gas selected) is from 700 sccm to 1000 sccm, while that of the third predetermined time period is from 24 seconds to 36 seconds. The process sequence from the second step of reducing the chamber pressure to base pressure to the fourth step of maintaining the equipment chamber at the second predetermined temperature is subsequently repeated a predetermined number of times, typically 4 to 6 times. Finally, the equipment chamber is returned to the idle state.

It has been determined that the repeated portion of the process sequence helps maintain an equipment chamber in a preconditioned and low particulate state for semiconductor substrate layer deposition. This is because the equipment chamber is repeatedly purged of particulates and is at a suitable temperature for a subsequent semiconductor substrate layer deposition process when it is returned to the idle state. It should be noted that in processes according to the present invention, maintaining the equipment chamber at a "predetermined temperature" includes circumstances where there is a temperature gradient across the equipment chamber and any associated hardware, and the temperature, therefore, is not uniform. For example, the equipment chamber is said to be maintained at a "predetermined temperature" during processes in accordance with the present invention in a situation where a chamber heater is set at a given temperature, resulting in a temperature gradient across the equipment chamber due to uneven heat transfer. Since the temperature and/or temperature gradient within the equipment chamber is a function of other process parameters (e.g. gas flow rate and equipment chamber pressure), each of the three "predetermined" temperatures in processes according to the present invention can be different from, or the same as, any of the remaining two "predetermined" temperatures.

Also provided is a specific process tailored for maintaining a TiN layer deposition equipment chamber (e.g. Applied Materials Endura 5500 CVD TiN layer deposition equipment chamber) and associated chamber showerhead and chamber heater in a preconditioned and low particulate state between successive TiN layer depositions. The steps of the process include first determining that the equipment chamber has been in an idle state for at least 5 minutes, followed by reducing the equipment chamber to a base pressure in the range of $1 \times 10^{-6}$ Torr to $1 \times 10^{-8}$ Torr in the absence of gas flow, while simultaneously maintaining the associated chamber heater at a temperature in the range of 445° C. to 455° C. The temperature of the associated chamber heater then continues to be maintained for 240 seconds to 360 seconds, while the equipment chamber is maintained at a pressure in the range of 2 Torr to 4 Torr with helium gas flowing through it at 500 sccm. The equipment chamber is subsequently purged with nitrogen gas at 1000 sccm for 25 seconds to 35 seconds, while the associated chamber heater continues to be maintained at a temperature in the range of 445° C. to 455 ° C. The portion of the aforementioned process sequence that is subsequent to the step of determining that the equipment chamber is in an idle state is then repeated a total of 5 times before the equipment chamber is returned to the idle state.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

Figure 1:
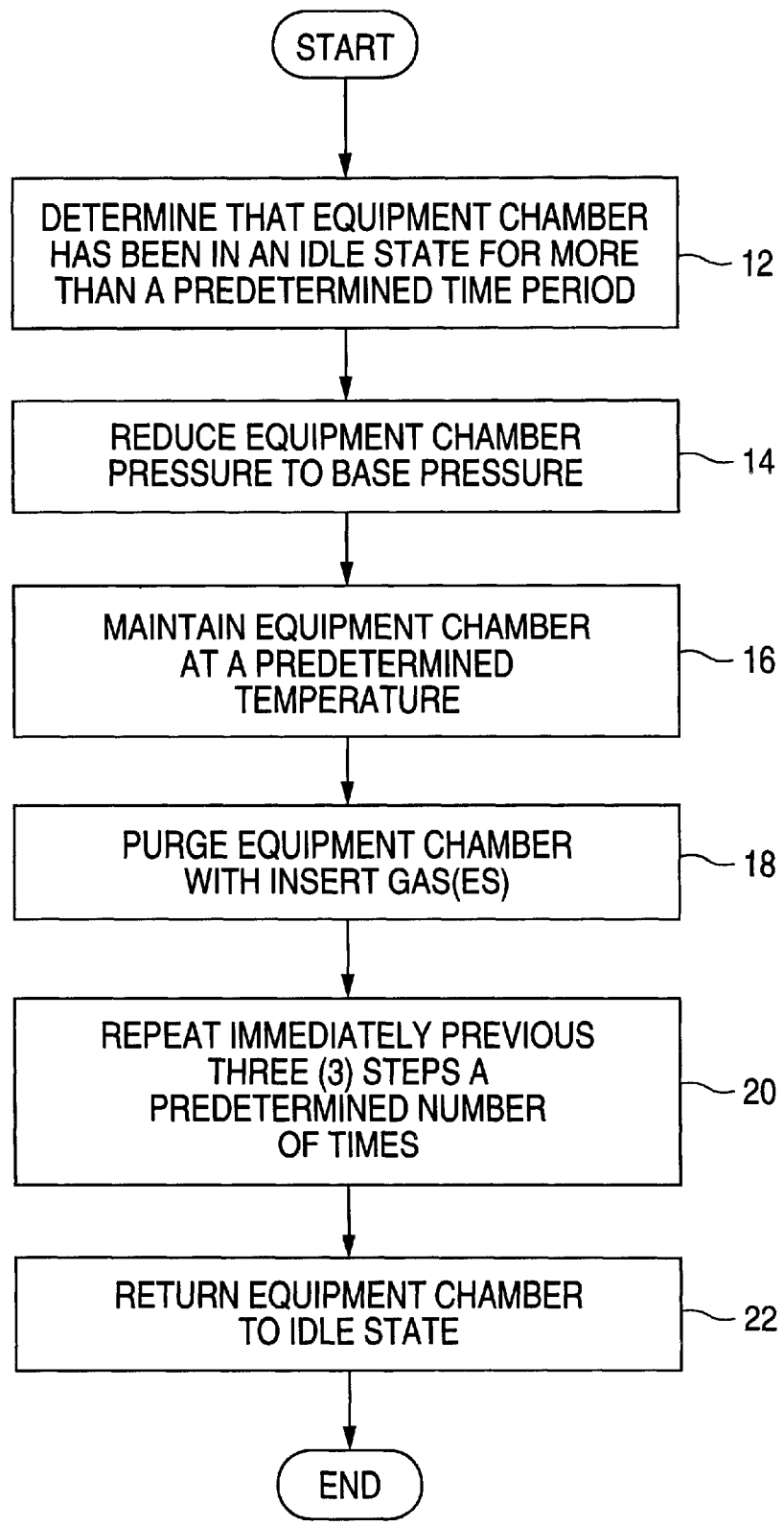
FIG. 1 is a flow diagram illustrating the process sequence according to the present invention.

To be consistent throughout the present specification and claims, and for a clear understanding of the present invention, the following definitions are hereby provided for the terms used therein:

The term "preconditioned state" refers to a semiconductor substrate layer deposition equipment chamber condition/state, wherein parameters (e.g. temperature, pressure and environment) associated with the equipment chamber and its hardware (e.g. chamber heaters and chamber showerheads) are suitable for the commencement of a semiconductor substrate layer deposition process.

The terms "particulate" and "particle" refers to solid pieces of material with readily definable boundaries, including those pieces of material which originate from sources within a semiconductor substrate layer deposition equipment chamber. For a further definition of "particulate" see S. Wolf and R. N. Tauber, *Silicon Processing for the VLSI Era Volume 1—Process Technology*, 514, (Lattice Press, 2nd ed. 1986), which is hereby incorporated by reference. The term "idle state" refers to an equipment chamber state and the associated time period during which a semiconductor substrate layer deposition equipment chamber is not processing semiconductor substrates. Therefore, the "idle state" includes such situations as where the equipment chamber is not depositing a material layer on the semiconductor substrates, as well as where the semiconductor substrates are not being transferred to or from the equipment chamber.

The term "base pressure" refers to the lowest chamber pressure that can be obtained within a given semiconductor substrate layer deposition equipment chamber using the standard pumping apparatus and pumping procedures associated with that equipment chamber.

FIG. 1 illustrates steps in a process in accordance with the present invention for maintaining a semiconductor substrate layer deposition equipment chamber in a preconditioned and low particulate state between successive layer depositions. At a first step 12 a determination is made that the equipment chamber has been in an idle state for a first predetermined time period between successive semiconductor substrate layer depositions. The first step insures that processes according to the present invention are run at times when the equipment chamber is not needed to process semiconductor substrates. Therefore, by determining that the equipment chamber is indeed in an idle state before further performing the remainder of a process sequence in accordance with the present invention, equipment throughput is optimized and equipment downtime is minimized. The first step is also designed to prevent the equipment chamber from remaining in an idle state for an excessive time period that can lead to particulate generation within the equipment chamber, as well as deviation of the equipment chamber temperature from a suitable temperature for the commencement of a subsequent semiconductor substrate layer deposition process. The determination can be made by a sensor or software program resident in semiconductor equipment associated with the equipment chamber, or by a human operator. Next, in a second step 14, the pressure in the equipment chamber is reduced to "base" pressure using standard hardware (e.g. pumps, isolation valves, and throttle vales) associated with the chamber. During the second step 14, no gas is flowing through the equipment chamber and the equipment chamber temperature is maintained at a first predetermined temperature. The maintaining of the equipment chamber temperature can be done using techniques that are well known to those skilled in the art, for example, by employing a chamber heater controlled to a constant temperature.

In a third step 16, the equipment chamber is then maintained at a second predetermined temperature and a first predetermined pressure for a second predetermined time period, while flowing an inert gas (e.g. argon, nitrogen, helium, hydrogen and mixtures thereof) through the equipment chamber at a first predetermined inert gas flow rate. The first predetermined pressure of the equipment chamber is greater than the base pressure. The inert gas, the first predetermined inert gas flow rate and the first predetermined pressure employed in the third step 16 are selected to optimize heat transfer within the equipment chamber and to foster the maintenance of the second predetermined temperature.

Next, in a fourth step 18, the equipment chamber is purged with an inert gas (e.g. argon, nitrogen, helium, hydrogen and mixtures thereof) at a second predetermined inert gas flow rate for a third predetermined time period, while maintaining the equipment chamber at a third predetermined temperature. The fourth step is designed to dislodge particulates from the equipment chamber and associated hardware (e.g. a chamber showerhead) using the inert gas purge. Therefore, the second predetermined inert gas flow rate and the third predetermined time period are selected to achieve this objective. One of ordinary skill in the field, upon reading of this specification, can easily determine such inert gas flow rates and time periods that are suitable for the fourth step 18 using routine experimentation. The third predetermined temperature is selected so that the equipment chamber is in a proper preconditioned state, at the conclusion of processes in accordance with the present invention, for commencement of a subsequent semiconductor substrate layer deposition process. A suitable third predetermined temperature is one that provides for a uniform temperature, and thus a uniform deposition rate, across a series of semiconductor substrates to be processed in the equipment chamber. In other words, the first semiconductor substrate processed in the equipment chamber has the same semiconductor substrate temperature during the semiconductor substrate layer deposition as the remainder of the semiconductor substrates within the series.

Next, in a fifth step 20, the second step 14 through the fourth step 18 are repeated a predetermined number of times to enhance the effectiveness of particulate reduction. It is theorized, without being bound, that the enhanced effectiveness of particle reduction is due to the combination of repeated equipment chamber pressure cycling between the base pressure in the second step 14 and the first predetermined pressure in the third step 16, as well as the repetitive equipment chamber purges with inert gas at relatively high second predetermined inert gas flow rates in the fourth step 18.

Finally, in a sixth step 22, the equipment chamber is returned to the same idle state as prior to commencement of the process in accordance with the present invention at the first step 12. If the equipment chamber were to remain in this idle state for the first predetermined time period, then the process in accordance with the present invention will once again commence.

Also provided is a process tailored for maintaining a TiN layer deposition equipment chamber, such as an Applied Materials Endura 5500 CVD TiN layer deposition equipment chamber, and associated chamber heater and chamber showerhead in a preconditioned and low particulate state between successive TiN layer depositions. This tailored process is best described by reference to the following example:

EXAMPLE

A process according to the present invention, detailed in Table 1 below, was implemented on an Applied Materials Endura 5500 CVD TiN layer deposition equipment chamber (available from Applied Material Corp., Santa Clara, Calif., USA) that included such hardware as a standard chamber heater and chamber showerhead, and the results evaluated. The implemented process does not require the use of "dummy wafers." Further, the implemented process does not commence if semiconductor substrates are being processed in the equipment chamber, or if the equipment chamber has only been in an idle state for less than a predetermined time period (see Step 1 of Table 1).

In Step 2 of Table 1 the chamber pressure is then reduced to "base" pressure using conventional low pressure pumping apparatus, such as a throttle valve and low pressure pumps. The "base" pressure for an Applied Materials Endura 5500 CVD TiN layer deposition equipment chamber is typically in the range of $1 \times 10^{-6}$ Torr to $1 \times 10^{-8}$ Torr. During Step 2 the chamber heater is maintained at a first predetermined temperature that is essentially the same chamber heater temperature as set during a TiN layer deposition process (i.e. 450° C). A temperature within ±5° C. of the chamber heater temperature set during the TiN layer deposition process (i.e. 445° C. to 455 ° C.) will insure that the TiN layer deposition rate remains constant upon commencement of, and throughout, successive TiN layer deposition processing. During this step, the chamber heater spacing (i.e. the spacing between a chamber heater and a chamber showerhead) is 500 mils and there is no gas flow through the equipment chamber.

Next, there is a preparatory step, where the equipment chamber is prepared for Step 3 of Table 1 by initiating a helium gas flow through the equipment chamber at flow rate of 500 sccm and changing the chamber heater spacing to 270 mils. During this preparatory step, a throttle valve located between the equipment chamber and the low pressure pumps is fully open (hence the "Full Open" notation in Table 1) and the resultant equipment chamber pressure is between about 1 Torr and 4 Torr. Besides helium, other inert gases, such argon, nitrogen or mixtures thereof, can also be employed. The 10 second time period provides sufficient time to change the chamber heater spacing and stabilize the helium gas flow rate at 500 sccm in preparation for Step 3.

Next, in Step 3 of Table 1, the chamber heater temperature is maintained at 450° C. for 300 seconds with an inert gas (i.e. helium) flowing through the equipment chamber at a flow rate of 500 sccm. Step 3, along with Step 4 discussed below, are designed to place the equipment chamber temperature, including the chamber showerhead located therein, at the temperature of a subsequent TiN layer deposition process, thereby placing the equipment chamber in a preconditioned state for the processing. The time period (i.e. 300 seconds) and equipment chamber pressure (i.e. 3 Torr) in Step 3 are selected to optimize heat transfer within the equipment chamber and thoroughly heat the chamber showerhead. The range of the time period and equipment chamber pressure of this step can be varied from 240 seconds to 360 seconds and from 2 Torr to 4 Torr, respectively, while still obtaining adequate results.

Next, in Step 4 of Table 1, the equipment chamber is purged with $N_2$ gas at a flow rate of 1000 sccm. The high $N_2$ gas flow of 1000 sccm ±100 sccm flows from the chamber showerhead onto the chamber heater dislodging particulates from this associated hardware, as well as from the equipment chamber walls. $N_2$ gas, rather than argon or helium, is employed for the particulate dislodgement, since it is believed that the relatively large size and mass of the $N_2$ molecule is more beneficial for this purpose.

Then, there is another preparatory step, where the $N_2$ gas is pumped out of the equipment chamber in preparation for either (i) returning to Step 2 so that the process sequence from Step 2 to this preparatory step can be repeated for a predetermined number of times, or (ii) returning the equipment chamber to its idle state after the completion of the repetitive process sequence for the predetermined number of times. Step 2 through this preparatory step are repeated 5±1 times before the equipment chamber is returned to its idle state.

The process according to the present invention, detailed in Table 1 below, was evaluated on a standard Applied Materials Endura 5500 CVD TiN layer deposition equipment chamber. The equipment chamber was equipped with a standard chamber showerhead, through which gases are introduced into the equipment chamber, and a standard chamber heater.

TABLE 1

| Step | Time (sec) | Pressure | Heater Temperature | Heater Spacing | Gas & Flow Rate | Power (W) |
|---|---|---|---|---|---|---|
| 1 | Determination that Equipment Chamber has been in an Idle State for More Than a Predetermined Time Period | | | | | |
| 2 Prep. For Step 3 | 8 | "Base" | 450° C. | 500 mils | None | 0 |
| | 10 | Full Open | 450° C. | 270 mils | He, 500 sccm | 0 |
| 3 | 300 | 3.0 Torr | 450° C. | 270 mils 500 sccm | He, | 0 |
| 4 | 30 | Full Open | 450° C. | 270 mils | $N_2$, 1.0 slm | 0 |
| Prep. Step | 5 | Full Open | 450° C. | 270 mils | None | 0 |

During conventional TiN layer deposition processing with the standard Applied Materials Endura 5500 CVD TiN layer deposition equipment chamber, particulate generation in the equipment chamber routinely exceeded 81 particles ($\geq 0.30$ micron in size) per processed semiconductor substrate after 3000 semiconductor substrates had been processed in the equipment chamber. A full equipment chamber wet clean was then required to restore the particulate generation level to $\leq 50$ particles per processed semiconductor substrates. This full equipment chamber wet clean involved opening the equipment chamber, removing "dirty" hardware (e.g. the chamber heater) and replacing it with freshly cleaned hardware, and wiping down the equipment chamber using conventional techniques. This full equipment chamber wet clean procedure and subsequent preconditioning of the equipment chamber took 24 hours, resulting in significant equipment downtime, thereby decreasing equipment throughput. After implementation of the process according to the present invention, as described in Table 1 above, 4800 semiconductor substrates were able to be processed through the standard Applied Materials Endura 5500 CVD TiN layer deposition equipment chamber, without particulate generation in the equipment chamber exceeding 81 particles ($\geq 0.30$ micron in size) per processed semiconductor substrate. The implementation of the process according to the present invention resulted in increased equipment throughput. In addition, the equipment chamber was also maintained in a proper preconditioned state, with respect to equipment chamber pressure, temperature and environment, for commencement of TiN layer deposition processing.

It should be understood that various alternatives to the embodiments of the invention described herein may be employed in practicing the invention. For example, while specific temperatures, times, pressures and flow rates have been set forth to illustrate the invention, they are not intended to limit the invention. It is intended that the following claims define the scope of the invention and that methods within the scope of these claims and their equivalents be covered thereby.

What is claimed is:

1. A method of maintaining a semiconductor substrate layer deposition equipment chamber in a preconditioned and low particulate state between successive layer depositions, the method comprising:

determining that the equipment chamber has been in an idle state for more than a first time period;

reducing the pressure in the equipment chamber to a base pressure, while maintaining the equipment chamber at a first temperature;

maintaining the equipment chamber at a second temperature and at a first pressure for a second time period, the first pressure being greater than the base pressure, while flowing an inert gas through the equipment chamber at a first inert gas flow rate;

purging the equipment chamber with an inert gas at a second inert gas flow rate for a third time period, the second inert gas flow rate being greater than the first inert gas flow rate, while maintaining the equipment chamber at a third temperature;

repeating the reducing step, the maintaining step and the purging step a preselected number of times; and returning the equipment chamber to the idle state, whereby the equipment chamber is maintained in a preconditioned and low particulate state for commencement of a subsequent layer deposition.

2. The method of claim 1, and wherein the third temperature is within 5° C. of an equipment chamber temperature of the subsequent layer deposition.

3. The method of claim 1, and wherein the maintaining step includes flowing an inert gas selected from the group consisting of helium, argon, nitrogen, hydrogen and mixtures thereof.

4. The method of claim 1, and wherein the purging step includes flowing an inert gas selected from the group consisting of helium, argon, nitrogen, hydrogen and mixtures thereof.

5. The method of claim 1, and wherein the reducing step includes reducing the pressure in the equipment chamber to a base pressure in a range of $1\times 10^{-6}$–$1\times 10^{-8}$ Torr.

6. The method of claim 1, and wherein the maintaining step includes maintaining the equipment chamber at a first pressure in a range of 2–4 Torr.

7. The method of claim 1, and wherein the purging step includes purging for a third time period in a range of 25–35 seconds.

8. The method of claim 1, and wherein the determining step includes determining that the equipment chamber has been in an idle state for more than the first time period between successive CVD TiN layer depositions.

9. The method of claim 1, and wherein the determining step includes determining that the equipment chamber has been in an idle state for more than the first time period between successive CVD W layer depositions.

10. The method of claim 1, and wherein the determining step includes determining that the equipment chamber has been in an idle state for more than the first time period between successive CVD TEOS layer depositions.

11. The method of claim 1, and wherein the determining step includes determining that the equipment chamber has been in an idle state for more than 5 minutes.

12. A method of maintaining a TiN layer deposition equipment chamber, chamber showerhead and chamber heater in a preconditioned and low particulate state between successive TiN layer depositions, the method comprising:

determining that the equipment chamber has been in an idle state for at least 5 minutes;

reducing the pressure in the equipment chamber to a base pressure in a range of $1\times 10^{-6}$–$1\times 10^{-8}$ Torr, while maintaining the chamber heater at a temperature in a range of 445–455° C.;

maintaining the chamber heater at a temperature in a range of 445° C.–455° C. for 240–360 seconds, while maintaining the equipment chamber at a pressure in a range of 2–4 Torr and flowing helium gas through the equipment chamber at about 500 sccm;

purging the equipment chamber with nitrogen gas at about 1000 sccm for 25–35 seconds, while maintaining the chamber heater at a temperature in a range of 445–455° C.;

repeating the reducing step, the maintaining step and the purging step a predefined number of times; and returning the equipment chamber to the idle state, whereby the equipment chamber is maintained in a preconditioned and low particulate state for commencement of a subsequent TiN layer deposition.

13. The method of claim 12, and, wherein the reducing step is conducted with a chamber heater spacing of about 500 mils.

14. The method of claim 12, and, wherein the maintaining step is conducted with a chamber heater spacing of about 270 mils.

* * * * *